(12) United States Patent
Kono et al.

(10) Patent No.: US 6,433,566 B1
(45) Date of Patent: Aug. 13, 2002

(54) PROBING METHOD AND PROBING SYSTEM

(75) Inventors: Isao Kono, Higashiyamanashi-gun; Isamu Inomata, Kitakoma-gun, both of (JP)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 09/644,836

(22) Filed: Aug. 24, 2000

(30) Foreign Application Priority Data

Sep. 14, 1999 (JP) .......................................... 11-261106

(51) Int. Cl.[7] ........................ G01R 31/02; G01R 31/26; G01R 11/00
(52) U.S. Cl. ..................... 324/758; 324/765; 324/158.1
(58) Field of Search .............................. 324/758, 158.1, 324/760, 764, 675, 754, 755

(56) References Cited

U.S. PATENT DOCUMENTS 5,604,446 A * 2/1997 Sano ........................ 324/758
6,297,656 B1 * 10/2001 Kobayashi et al. ......... 324/758

FOREIGN PATENT DOCUMENTS

| JP | 9-202476 | 8/1997 |
| JP | 11-30651 | 2/1999 |

* cited by examiner

*Primary Examiner*—N. Le
*Assistant Examiner*—J Kerveros
(74) *Attorney, Agent, or Firm*—Oblon, Spivak, McClelland, Maier & Neustadt, P.C.

(57) ABSTRACT

A probing method for inspecting electrical characteristics of an object by probes, including mounting the object on a main chuck having an X-axis, a Y-axis and a Z-axis which are driven by X-axis, Y-axis, and Z-axis driving mechanisms, moving the main chuck in X-, Y-, and Z-directions by driving the X-axis, Y-axis and Z-axis by the X-axis, Y-axis, and Z-axis driving mechanisms such that each of electrode pads of the object mounted on the main chuck is brought into contact with each of probes of a probe card above the main chuck, and overdriving the main chuck by simultaneously and collectively controlling the X-axis, Y-axis, and Z-axis driving mechanisms such that the X-axis, Y-axis, and Z-axis driving mechanisms simultaneously overdrive the main chuck to keep a tip portion of each of the probes within a surface area of the electrode pad of the object.

11 Claims, 5 Drawing Sheets

PROBING METHOD AND PROBING SYSTEM

CROSS-REFERENCE TO RELATED APPLICATIONS

This application is based upon and claims the benefit of priority from the prior Japanese Patent Application No. 11-261106, filed Sep. 14, 1999, the entire contents of which are incorporated herein by reference.

BACKGROUND OF THE INVENTION

The present invention relates to a probing method and probing system, and more specifically, a probing method and probing system ensuring an increase of the throughput.

A probing device 10 has a loading (loader) chamber 11, a probing (prober) chamber 12, a controller 13, and a display unit 14, as shown in FIG. 6. In the loading chamber 11, wafers W stored in a cassette C are taken out one by one and transferred to the probing chamber 12. The probing chamber 12 is adjacent to the loading chamber 11. The wafer W transferred from the loading chamber 11 is inspected in the probing chamber 12. The controller 13 controls the probing chamber 12 and the loading chamber 11. The display unit 14 is also used as an operation panel for controlling the controller 13.

In the loading chamber 11, tweezers 15 are provided via a rotary shaft. The tweezers 15 are used for transferring the wafer W. More specifically, the tweezers 15 take out the wafers W stored in the cassette C one by one and transfer them to the probing chamber 12 through back-and-forth movement in a horizontal direction simultaneously with clockwise-and-counterclockwise rotation. A sub-chuck 16 is provided near the tweezers 15, for prealigning the wafer W. The sub-chuck 16 receives the wafer W from the tweezers 15 and rotates clockwise and counterclockwise in a θ direction, to prealign the wafer W by using an orientation flat of the wafer W as a reference.

The probing chamber 12 has a main chuck 17 for mounting the wafer W thereon. The main chuck 17 is moved in X and Y directions by means of X and Y stages 18, 19 and further moved in θ and Z directions by built-in driving mechanisms. Furthermore, the probing chamber 12 has an alignment means 20 for aligning the wafer W with a probe card. The alignment means 20 has an alignment bridge 21 which has a first photographic means 21 (CCD camera or the like) for taking a picture of the wafer W, and a pair of guide rails 23, 23 which guide reciprocal movement of the alignment bridge 22 in the Y direction. A second photographic means (not shown), which is attached to the main chuck 17, is also included in the alignment means 20. The probe card (not shown) is provided above the upper surface of the probing chamber 12. The upper surface of the probe card is electrically connected to a test head (not shown) by way of a connection ring. The probe card receives a test signal from a tester by way of the test head and the connection ring, thereby inspecting electrical characteristics of an IC (formed on the wafer W) in contact with the probe.

More specifically, the IC on the wafer W is inspected as follows: first, a single wafer W is taken out from the cassette C by means of the tweezers 15 within the loading chamber 11. While the wafer W is transported by the tweezers 15 to the probing chamber 12, the wafer W is pre-aligned at a sub-chuck 16. In the probing chamber 12, the wafer W is passed from the tweezers 15 to the main chuck 17. Then, the alignment bridge 22 is moved above a probe center to align the wafer W on the main chuck 17 by means of the first photographic means 21 and the second photographic means attached to the main chuck 17. Thereafter, the wafer W is indexed by moving the main chuck 17 in the X and Y directions. After the main chuck 17 is moved up in the Z direction to allow the wafer W to be in contact with the probe, the main chuck 17 is overdriven. In this manner, each of the IC chips on the wafer w can be electrically in contact with the probe, with the result that electrical characteristics of each of the chips can be checked.

In the case of the wafer W having a size (diameter) of 200 mm or less, when the main chuck 17 is overdriven as shown in FIG. 7A, the wafer W mounted on the main chuck 17 is moved up along the z direction from the position indicated by a dash-dotted line to the position indicated by a solid line while being maintained almost horizontal, as shown in a solid line in FIG. 7A. During this period, the probe 24A of the probe card 24 is elastically lifted up from the position indicated by a dash-dotted line to the position indicated by a solid line in the FIG. 7A. The tip of the probe moves from a start point S to an end point E (indicated by a thick solid line). When the movement of the probe tip from the start point S to the end point E is viewed from above, the probe stays within the surface area of the electrode pad P of the IC chip, as shown by an arrow of the hatched line (see FIG. 7B). Since the probe 24A can maintain electrical contact with the electrode pad P, the electrical characteristics of the IC chip can be checked precisely.

However, if the size of the wafer is as large as e.g., 300 mm, the IC chip is not necessarily enlarged but miniaturized. Since the pitch between electrode pads is decreased, the number of pins of the probe card is accordingly increased up to about 2000. As a result, the load of the probe 24A applied on the main chuck 17 during the overdriving time results in, for example, 10 to 20 Kg. When the wafer W is overdriven from the position indicated by a dash-dotted line and comes into contact with the probe 24A, the load of the probe 24A is locally applied to the main chuck.

Due to the local application of the load, the rotary shaft (not shown) of the main chuck 17 is distorted, with the result that the wafer W is inclined by about 20–30 $\mu$m, as shown by a solid line in the figure. That is, the wafer W is inclined outward from the position where the wafer W should be moved up. At that time, the tip portion of the probe 24A is lifted up from the position indicated by a dash-dotted line to the position indicated by a solid line in FIG. 8A. The moving distance is longer than the case shown in FIG. 7A. That is, the wafer moves as is indicated by a thick solid line in FIG. 8A. Although the start point S of the tip portion in this case is the same as that shown in FIG. 7A, the end point E is deviated from the electrode pad P as shown by a hatched arrow in FIG. 8B. Therefore, the tip portion may fall outside the electrode pad P. If this happens, a test signal cannot be sent from the probe 24A to the electrode pad P. As a result, the inspection will not be performed with high reliability.

The present applicant suggests a probing method and probing device in Japanese Patent Application No. 9-202476 for performing electrical inspection with high reliability by ensuring that a probe is in contact with an electrode pad of a wafer even if a load is locally applied to the main chuck. In this probing method, the correction amounts of the main chuck at the time of overdriving in the X, Y and Z directions are first obtained on the basis of data of the wafer chuck, wafer and probe card. The moving distances of the main chuck in the X, Y, and Z directions are corrected on the basis of the obtained correction amounts. In this way, the main chuck is overdriven.

FIG. 9 shows a system in which servo motors 31, 32 are employed as an X-axis driving mechanism and a Y-axis driving mechanism for moving a main chuck 17 in the X and Y directions, and a stepping motor 33 is used as a Z-axis driving mechanism for driving the main chuck 17 in the Z-axis. In this system, the stepping motor 33 differs in operational characteristics from the servo motors 31, 32. Therefore, it is virtually impossible to start or stop the driving of the servo motors 31, 32 simultaneously with the stepping motor 33. Conventionally, the motors 31, 32, 33 are independently driven and stopped.

BRIEF SUMMARY OF THE INVENTION

The applicant found that if the X-axis motor, the Y-axis motor, and the Z-axis motor are driven alternately and separately in a plurality of steps on the basis of the signals from drivers and the stepping driver which are driven by the instruction from a host computer, in the aforementioned probing method, a probe moves in a zigzag movement to reach a target position (end point E), as shown in FIGS. 10 and 11. In this method, it is possible to ensure the probe to be in contact with an electrode pad. However, each of the motors is driven and stopped a plurality of times and the main chuck is moved in a zigzag manner, so that the throughput decreases.

The present invention is made to overcome the aforementioned problem.

An object of the present invention is to provide a probing method and probing system ensuring an increase of its throughput without driving a plurality of driving mechanisms in separate steps for moving the main chuck.

Another object of the present invention is to provide a probing method and probing system ensuring an increase of its throughput without driving a plurality of driving mechanism in separate steps even if a driving mechanism different in operational characteristics is employed as the driving mechanism for the main chuck.

Still another object of the present invention is to collectively and simultaneously control the X-axis driving mechanism, Y-axis driving mechanisms and Z-axis driving mechanism.

A further object of the present invention is that the X-axis driving mechanism, Y-axis driving mechanism, and Z-axis driving mechanism are collectively and simultaneously controlled by an imaginary controller operated on the basis of instruction signals sent from a host computer.

A still further object of the present invention is that the X-axis driving mechanism, Y-axis driving mechanism, and Z-axis driving mechanism are collectively and simultaneously controlled on the basis of control signals from the same protocol.

According to a first aspect of the present invention, there is provided a probing method for inspecting electrical characteristics of an object by probes, comprising the steps:

mounting the object on a main chuck having an X-axis, a Y-axis and a Z-axis which are driven by an X-axis driving mechanism, a Y-axis driving mechanism and a Z-axis driving mechanism, respectively;

moving the main chuck in X-, Y-, Z-directions by driving the X-axis, Y-axis and Z-axis by the X-axis driving mechanism, the Y-axis driving mechanism, and the Z-axis driving mechanism such that electrode pads of the object mounted on the main chuck are brought into contact with probes of probe card arranged above the main chuck; and overdriving the main chuck toward the probe card by simultaneously and collectively controlling the driving mechanisms such that a tip portion of each the probes stays within a surface area of each of the electrode pads of the object.

In the probing method, the driving mechanisms are preferably controlled by an imaginary controller operated on the basis of instruction signals from a host computer.

In the probing method, it is preferable that the driving mechanisms be collectively controlled by control signals based on the same protocol.

In accordance with a second aspect of the present invention, there is provided a probing method for inspecting electrical characteristics of an object by probes, comprising the steps:

mounting the object on a main chuck having an X-axis, a Y-axis and a Z-axis which are driven by an X-axis driving mechanism, a Y-axis driving mechanism and a Z-axis driving mechanism, the Z-axis driving mechanism being different from the X-axis and Y-axis driving mechanisms in operational characteristics;

moving the main chuck in X-, Y-, and Z-directions by driving the X-axis, the Y-axis and the Z-axis by the X-axis driving mechanism, the Y-axis driving mechanism, and the Z-axis driving mechanism such that electrode pads of the object mounted on the main chuck are brought into contact with probes of a probe card arranged above the main chuck; and overdriving the main chuck toward the probe card by simultaneously and collectively controlling the driving mechanisms on the basis of the same protocol by an imaginary controller which is controlled by instruction signals from a host computer such that each of probes stays within a surface area of each of the electrode pads of the object.

Preferably, the imaginary controller is constituted by software in the probing method.

In the probing method, the instruction signals from the host computer include at least one of data consisting of a target position of the main chuck to be overdriven and moving speeds of the main chuck in the X-, Y-, and Z-directions, driven by the X-, Y- and Z-driving mechanisms, respectively.

In accordance with a third aspect of the present invention, there is provided a probing system comprising:

a main chuck for mounting an object thereon;

X-, Y-, and Z-axis driving mechanisms for moving the main chuck in the X-, Y- and Z-directions, respectively;

a probe card arranged above the main chuck and having a plurality of probes electrically in contact with the object; and a control mechanism for simultaneously and collectively controlling each of the mechanisms to overdrive the main chuck toward the probe card such that a tip of each of the probes stays within a surface area of each of the electrode pads of the object.

In the probing system, it is preferable that the control mechanism should have an imaginary controller which is connected to a host computer by way of a network line.

In the probing system, it is preferable that the driving mechanisms be collectively controlled by control signals based on the same protocol.

In accordance with a fourth aspect of the present invention, there is provided a probing system comprising:

a main chuck for mounting an object;

driving mechanisms for moving the main chuck in X-, Y- and Z-directions;

a probe card arranged above the main chuck and having a plurality of probes electrically in contact with the object;

a control mechanism for controlling the driving mechanisms so as to overdrive the main chuck after the main chuck is moved in the X-, Y-, and Z-directions by means of the driving mechanisms to bring the object into contact with the probes of the probe card, the control mechanism comprising;

a host computer;

an imaginary controller being operated on the basis of instruction signals from the host computer, the imaginary controller being controlled by software set therein and controlling the main chuck simultaneously and collectively in accordance with the same protocol such that each of the probes stays within a surface area of each of electrode pads of the object when the main chuck is overdriven.

In the probing system, it is preferable that the instruction signals from the host computer include at least one of data consisting of a target position of the main chuck to be overdriven and moving speeds of the main chuck in the X-, Y-, and Z-directions, driven by the X-, Y- and Z-driving mechanisms.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
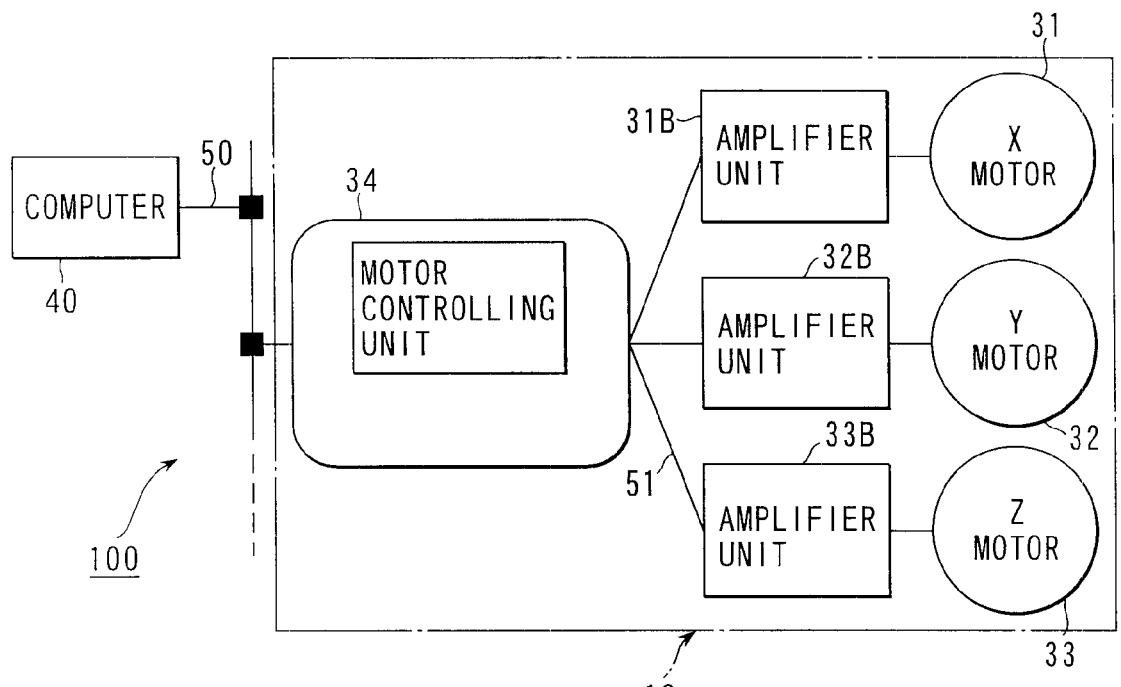
FIG. 1 is a block diagram showing a probing device used in the probing method of the present invention.

In the embodiment shown in FIGS. 1–5, like reference numerals are used to designate like structural elements. In the embodiment, as a specific example of the present invention, a probing method using an IC formed on a semiconductor wafer as an object will be explained. However, the present invention is not limited to the object to the IC. The present invention will be explained with reference to the embodiment shown in FIGS. 1–5. In the probing method according to the embodiment, a probing system 100 shown in FIG. 1 is used. The probing system 100 has a probing device 10 and a computer 40 for sending various types of instruction signals to the probing device 10, as shown in the figure. The probing device 10 and the computer 40 are connected to each other by a line (network line, field bus) 50. The probing device 10 has an X-axis driving mechanism 31 (hereinafter, referred to as "X-axis motor"), a Y-axis driving mechanism 32 (hereinafter, referred to as "Y-axis motor"), and a Z-axis driving mechanism 33 (Hereinafter, referred to as "Z-axis motor"). The aforementioned mechanisms 31, 32, and 33 are collectively controlled by a controller 34 (hereinafter, referred to as "imaginary controller") arranged in the probing device 10. The imaginary controller controls each of an X-axis motor 31, a Y-axis motor 32, and a Z-axis motor 33 on the basis of their operational characteristics. As a whole, the imaginary controller collectively and simultaneously controls these motors. It is preferable that the imaginary controller 34 should send control data to each of the motors in accordance with the same protocol (data-transmission format). Furthermore, the imaginary controller 34 can be constituted by software.

Figure 9:
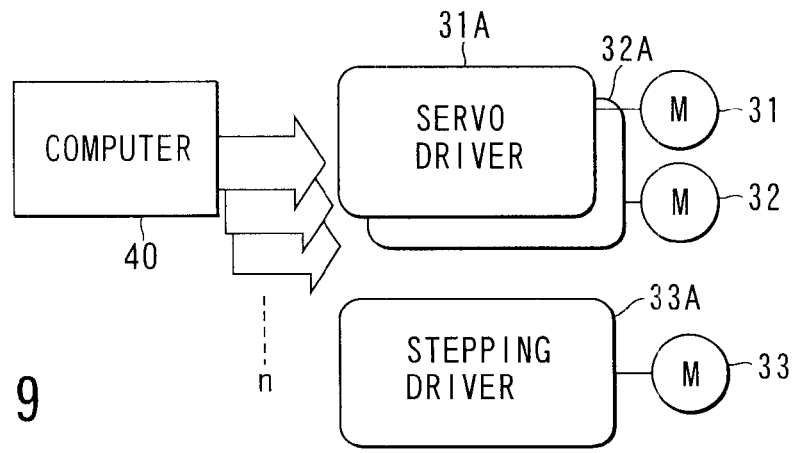
FIG. 9 is a schematic view showing the relationship between each of the driving mechanisms and a computer.
Figure 10:
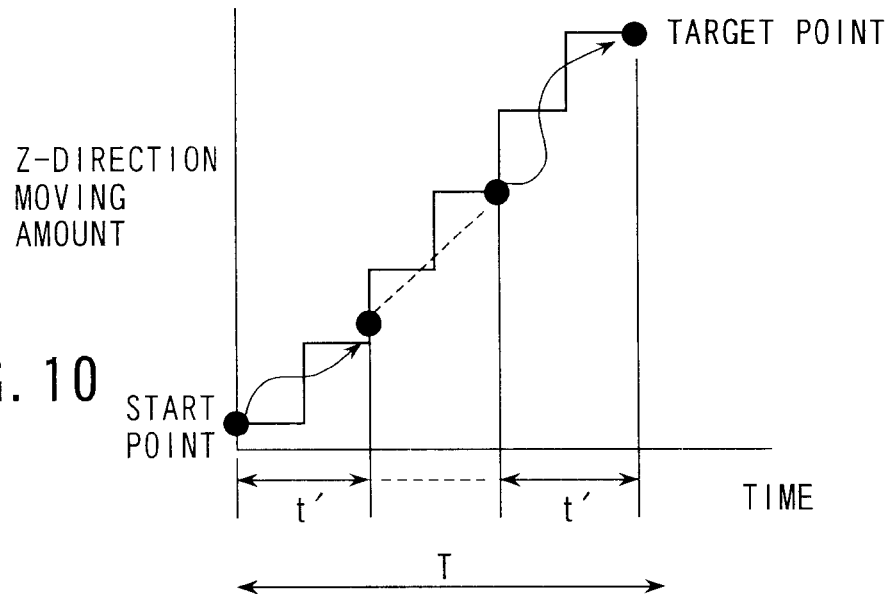
FIG. 10 is a graph showing the relationship between the over-driving time and the moving amount of a main chuck in the Z-direction.
Figure 11:
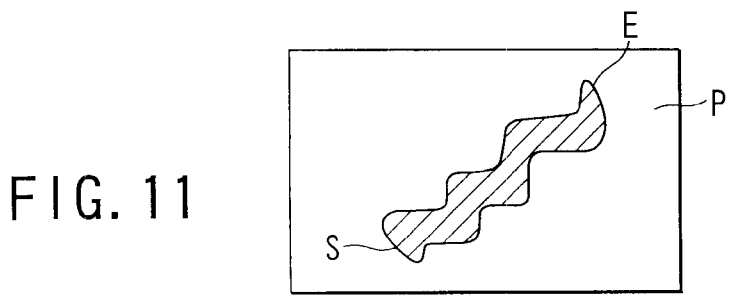
FIG. 11 is a plan view showing a moving trail of a probe needle on the electrode pad.

The imaginary controller 34 functions as drivers 31A, 32A, 33A (see FIG. 9) for controlling motors 31, 32, 33, respectively, so as to move a probe tip in accordance with a predetermined trail on the basis of the instruction signals received from a host computer 40.

Figure 2:
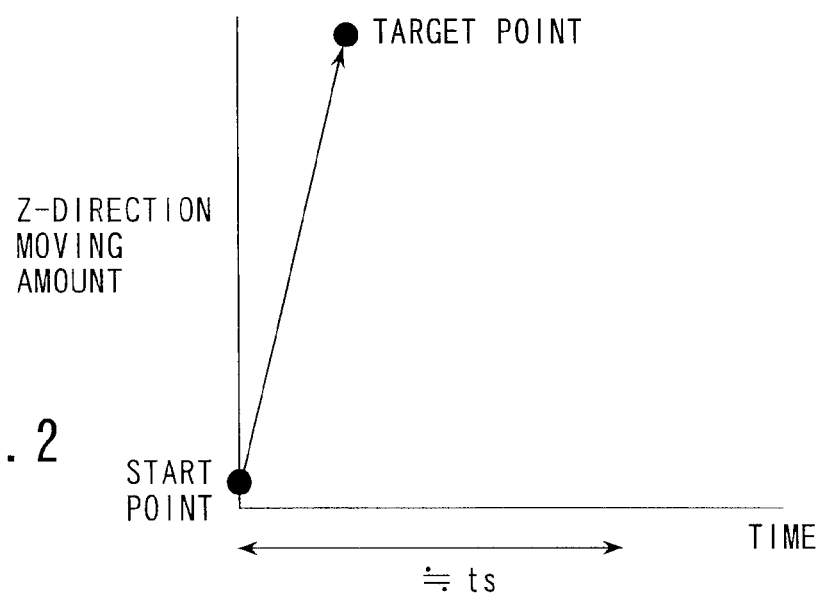
FIG. 2 is a graph showing the relationship between the overdriving time and the moving amount in the Z-axis direction in the probing method of the present invention.

When the main chuck is overdriven, the imaginary controller 34 receives positional data (three dimensional address) with respect to a start point and end point (target position) on the electrode pad of an object (e.g., IC on a wafer) in contact with the probe, and speed data of motors 31, 32, 33. As shown in FIG. 2, when the probe stays between the start point and the end point (target position) on the electrode pad of the wafer, the imaginary controller always captures the position of the probe tip on the wafer and controls the probe tip so as to move from the start point to the end point along a predetermined trail. The predetermined trail is preferably the shortest distance (ideal trail) or a distance near the shortest distance.

The motors 31, 32, 33 have respective drivers 31A, 32A and 33A (see FIG. 9), respectively. However, since the imaginary controller 34 is provided, these drivers 31A, 32A, 33A seem to be collectively and simultaneously controlled by the single imaginary controller 34. More specifically, the host computer 40 gives at least one of data consisting of three-dimensional addresses of the start point S and the end point E of the probe during the overdriving time and speed data of the motors 31, 32, 33, to the imaginary controller 34. The imaginary controller 34 controls the main chuck on the basis of the data given above, such that the probe moves from the start point S to the end point E on the electrode pad P along the predetermined trail (see FIG. 3), and that each of the probes is ensured to be in contact with the electrode pad P at the end point E.

Figure 3:
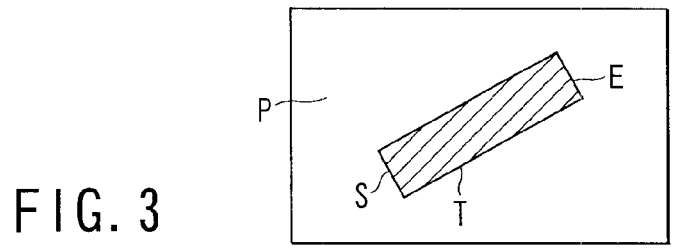
FIG. 3 is a plan view showing a moving trail of the tip portion of the probe formed on the electrode pad, by the probing method of the present invention.

Therefore, if the position of the probe in motion deviates from the predetermined trail by the reason of different operational characteristics of the motors 31, 32, 33, the deviation amount of the probe is automatically and momentarily corrected. To perform the correction extremely in a short time, it is preferable that the imaginary controller 34 be connected to each of the amplifier 31B, 32B, 33B of the motors 31, 32, 33 by a quick-responsible bus 51. As a result, as shown in FIG. 2, the probe moves along a predetermined trail (of the shortest distance) from the start point S to the end point E on the wafer W to terminate the overdrive in a short time. The trail of each of the probes tip preferably moves linearly on the electrode pad P of the wafer, as shown in FIG. 3.

Figure 8A:
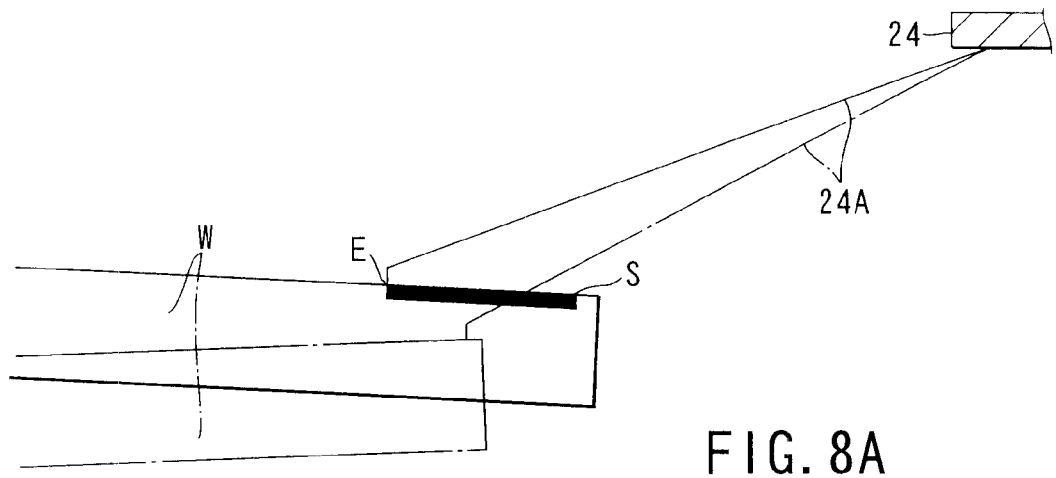
FIG. 8A is a magnified schematic view showing the relationship between a main chuck and a probe when the main chuck is overdriven in the probing method using a probe card having a large number of pins.
Figure 8B:
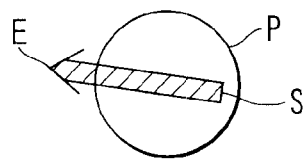
FIG. 8B is a view showing the moving trail of a probe tip on the electrode pad of FIG. 8A.

As mentioned, since load of the probes is locally applied to the object (e.g., wafer), the main chuck tilts, with the result that the probe sometimes falls outside the electrode pad P, as shown in FIGS. 8A and 8B. To prevent this phenomenon, the position of the probe is corrected in the probing method and probing system of the present invention. More specifically, at the inspection time, the main chuck moves up along the Z-axis direction to allow the wafer W to be in contact with a probe 24A at a position indicated by a dash-dotted line in FIG. 4. Thereafter, when the main chuck is overdriven, the wafer W moves from the position indicated by the dash-dotted line to the position indicated by a solid line. At that time, since load of the probe 24A is locally applied to the wafer W, the rotation axis of the main chuck 17 tilts outward from the right position where the main chuck should reach when it moves up vertically. The start point S of the needle of the probe 24A moves in the direction indicated by an arrow A in the figure.

Figure 4:
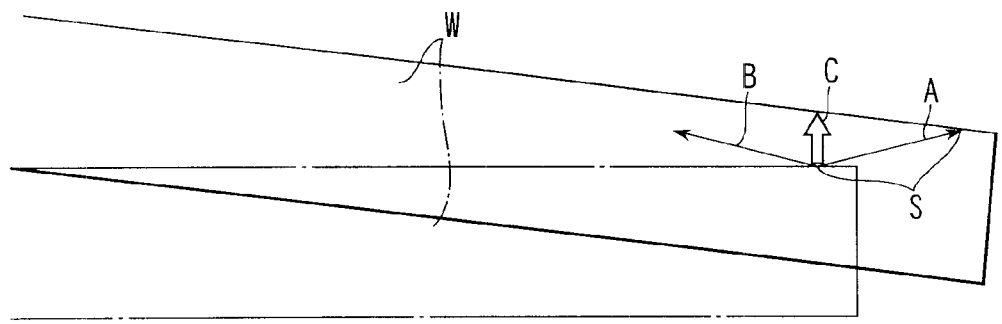
FIG. 4 is a schematic illustration for explaining a correction amount of the main chuck during the over-driving time.
Figure 6:
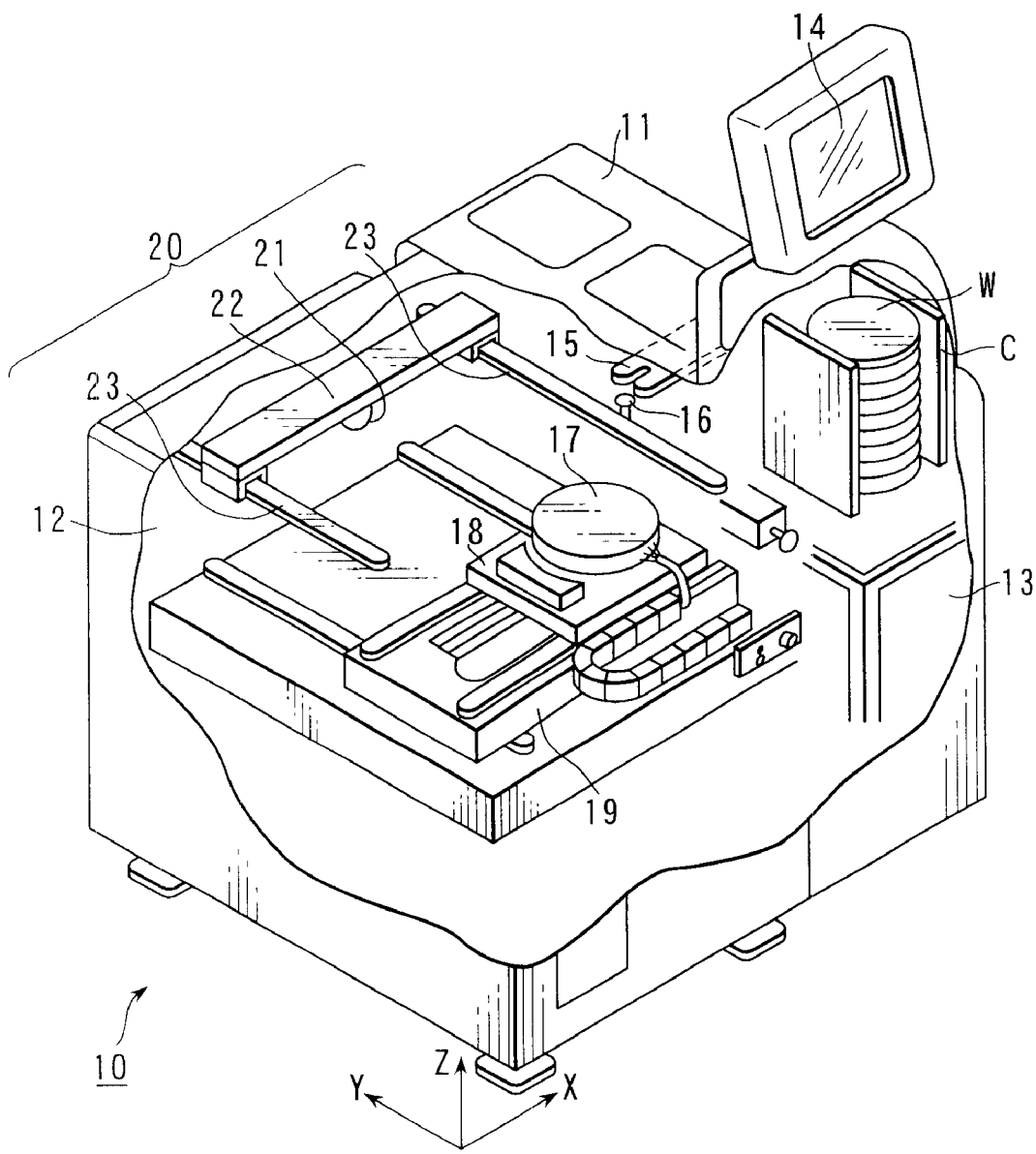
FIG. 6 is a perspective view of a part of a probing device, partly broken away.

In this case, the correction amounts of the main chuck 17 in the X, Y, and Z directions required to correct the movement is obtained by the controller 13 (see FIG. 6). As shown in FIG. 4, the position of the main chuck 17 is corrected on the basis of the correction amounts thus obtained, with the result that the wafer W moves in the direction indicated by an arrow B in the figure. The tip of the probe 24A is vertically lifted up as shown by an arrow C in the figure. It seems that the wafer W is moved up while being maintained horizontal.

Figure 5A:
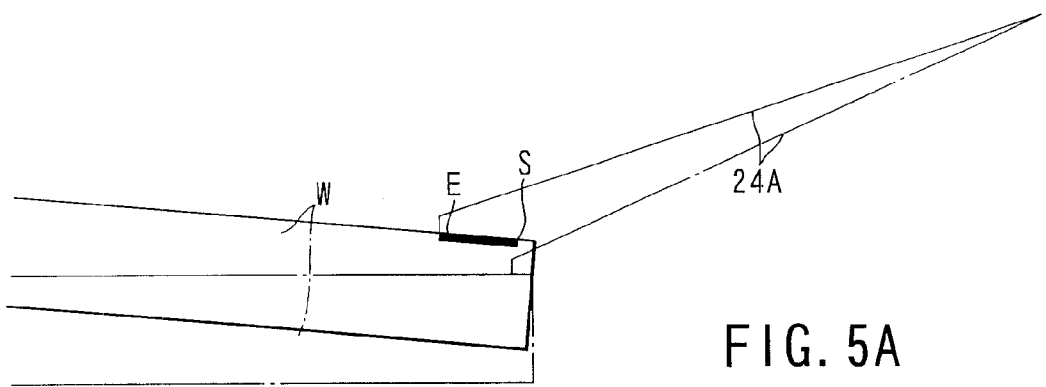
FIG. 5A is a partially enlarged schematic view showing the relationship between the main chuck whose moving amount is corrected and a probe needle.
Figure 5B:
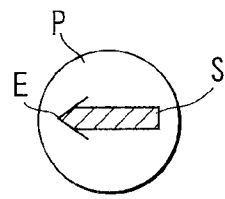
FIG. 5B is a view showing the relationship between an electrode pad and a moving trail of the probe tip.
Figure 7A:
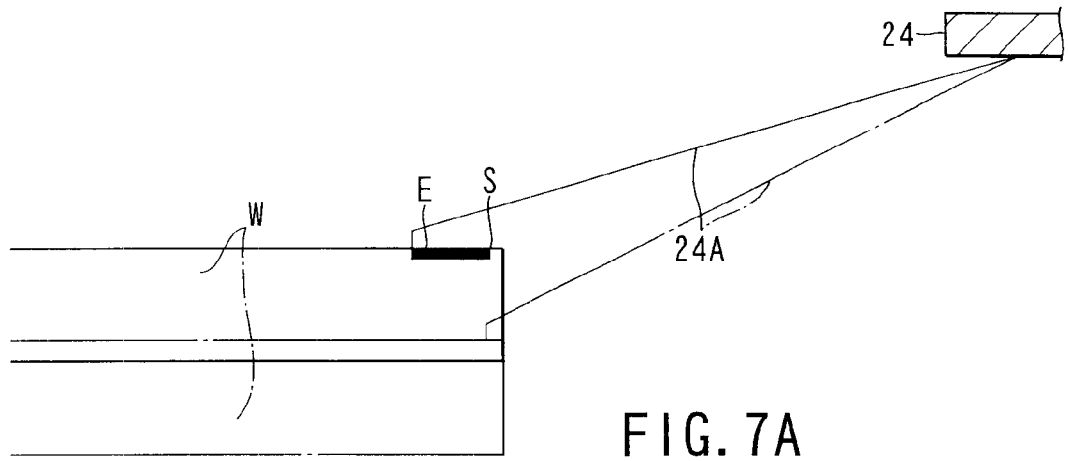
FIG. 7A is a magnified schematic view showing the relationship between a main chuck and a probe when the main chuck is overdriven in the probing method using a probe card having a small number of pins.
Figure 7B:
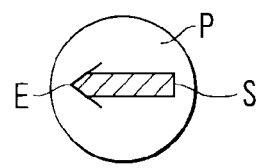
FIG. 7B is a view showing a moving trail of the probe tip on the electrode pad of FIG. 7A.

As a result, the probe tip moves along almost the same trail as in the case (see FIGS. 7A and 7B) where the wafer W is lifted up while being maintained horizontal as shown by a thick solid line in FIG. 5A. The end point E of the tip stays within the surface area of the electrode pad P as shown in FIG. 5B. Since each of the probes 24A is ensured to be in contact with the electrode pad P, the electrical characteristics of an object can be checked without fail.

In the conventional apparatus, it is difficult to initiate or terminate the driving operations of the main chuck 17 simultaneously in the X, Y and Z directions since weights of the X and Y stages 18, 19 differ, the moving distance of the probes 24A differs, moving resolutions of the X, Y and Z directions differ. It follows that the driving operations of the main chuck in the X, Y, Z, directions are initiated in different time points. Therefore, the main chuck 17 cannot be moved along a predetermined trail.

The larger the time difference in each of the directions, the larger the distance of the main chuck 17 deviated from the predetermined trail. It is therefore not possible to accurately control the main chuck 17. However, in this embodiment, the motors 31, 32, 33 seem to be controlled by a single imaginary controller (the imaginary controller) 34, with the result that the probe moves along the predetermined trail.

As explained in the foregoing, according to this embodiment, it is preferable that the X-axis motor 31, the Y-axis motor 32, and the Z-axis motor 33 are simultaneously and collectively controlled by instruction signals from the single imaginary controller 34. As a result, it is possible to correct the movement of the probe so as to move on the electrode pad P along the predetermined trail from the start point S to the end point E. Hence, the throughput of the inspection can be increased.

The imaginary controller 34 can be controlled by software set therein. It is preferable that the control data from the imaginary controller 34 should be sent to each of the motors 31, 32, 33 on the basis of the same protocol.

According to the embodiment, the probes can move on the electrode pad P along a predetermined trail (e.g. ideally a linear trail) by providing at least one of data consisting of three dimensional addresses of start point S and end point E of each of the probes and speed data of the motors 31, 32, 33, from the host computer 40 to the imaginary controller 34.

The present invention is not limited to the aforementioned embodiment. To be more specific, the technique for controlling the X-axis motor 31, the Y-axis motor 32 and the Z-axis motor 33 under the single imaginary controller 34, is included in the present invention.

According to the present invention, it is possible to provide a probing method and probing system ensuring an increase of the throughput without separately driving a plurality of driving mechanisms.

Furthermore, according to the present invention, it is possible to provide a probing method and probing system ensuring an increase of the throughput without separately driving a plurality of driving mechanisms different in operation characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probing method for inspecting electrical characteristics of an object by probes, comprising the steps:

mounting the object on a main chuck having an X-axis, a Y-axis and a Z-axis which are driven by an X-axis driving mechanism, a Y-axis driving mechanism and a Z-axis driving mechanism;

moving the main chuck in X-, Y-, and Z-directions by driving the X-axis, Y-axis and Z-axis by the X-axis driving mechanism, the Y-axis driving mechanism, and the Z-axis driving mechanism such that each of electrode pads of the object mounted on the main chuck is brought into contact with each of probes of a probe card arranged above the main chuck; and overdriving the main chuck by simultaneously and collectively controlling the X-axis, Y-axis, and Z-axis driving mechanisms such that the X-axis, Y-axis, and Z-axis driving mechanisms simultaneously overdrive the main chuck to keep a tip portion of each of the probes within a surface area of the electrode pad of the object.

2. The probing method according to claim 1, wherein the X-axis, Y-axis, and Z-axis driving mechanisms are controlled by a controller configured to be operated on the basis of instruction signals from a computer.

3. The probing method according to claim 1, wherein the X-axis, Y-axis, and Z-axis driving mechanisms are controlled by control signals based on a protocol.

4. A probing method for inspecting electrical characteristics of an object by probes, comprising the steps:

mounting the object on a main chuck having an X-axis, a Y-axis and a Z-axis which are driven by an X-axis driving mechanism, a Y-axis driving mechanism and a Z-axis driving mechanism, said Z-axis driving mechanism being different from the X-axis and Y-axis driving mechanisms in operational characteristics;

moving the main chuck in X-, Y-, and Z-directions by driving the X-axis, Y-axis and Z-axis by the X-axis driving mechanism, the Y-axis driving mechanism, and the Z-axis driving mechanism such that each of electrode pads of the object mounted on the main chuck is brought into contact with a probe of a probe card arranged above the main chuck; and overdriving the main chuck by simultaneously and collectively controlling the X-axis, Y-axis, and Z-axis driving mechanisms on the basis of a protocol by a controller which is controlled by instruction signals from a computer such that the X-axis, Y-axis, and Z-axis driving mechanisms simultaneously overdrive the main chuck to keep each of the probes within a surface area of each of the electrode pads of the object.

5. The probing method according to claim 4, wherein the controller comprises at least one software.

6. The probing method according to claim 4, wherein the instruction signals from the computer include at least one of data including a target position of the main chuck to be overdriven and moving speeds of the main chuck in the X-, Y-, and Z-directions, driven by the X-axis, Y-axis, and Z-axis driving mechanisms.

7. A probing system comprising:

a main chuck for mounting an object thereon;

X-, Y-, and Z-axis driving mechanisms configured to move the main chuck in the X-, Y- and Z-directions, respectively;

a probe card arranged above the main chuck and having a plurality of probes electrically in contact with the object; and a control mechanism for simultaneously and collectively controlling each of the mechanisms to overdrive the main chuck such that the X-axis, Y-axis, and Z-axis driving mechanisms simultaneously overdrive the main chuck to keep a tip of each of the probes within a surface area of each of the electrode pads of the object.

8. The probing system according to claim 7, wherein the control mechanism has a controller connected to a computer by a network line.

9. The probing system according to claim 7, wherein the X-axis, Y-axis, and Z-axis driving mechanisms are collectively controlled by control signals based on a protocol.

10. A probing system comprising:

a main chuck for mounting an object;

a plurality of driving mechanisms configured to move the main chuck in X-, Y- and Z-directions;

a probe card arranged above the main chuck and having a plurality of probes electrically in contact with the object;

a control mechanism for controlling the driving mechanisms so as to overdrive the main chuck after the main chuck is moved in the X-, Y-, and Z-directions by the driving mechanisms to bring the object into contact with the probes of the probe card, said control mechanism including a computer, a controller configured to be operated on the basis of instruction signals from the computer, said controller including at least one software and configured to control the main chuck simultaneously and collectively in accordance with a protocol such that the driving mechanisms simultaneously overdrive the main chuck to keep each of the probes within a surface area of each of electrode pads of the object when the main chuck is overdriven.

11. The probing system according to claim 10, wherein the instruction signals from the computer include at least one of data including a target position of the main chuck to be overdriven and moving speeds of the main chuck in the X-, Y-, and Z-directions, driven by the driving mechanisms.

* * * * *